(12) United States Patent
Wakamatsu et al.

(10) Patent No.: US 10,613,008 B2
(45) Date of Patent: Apr. 7, 2020

(54) SENSING SENSOR, INFORMATION PROCESSING DEVICE, SENSING METHOD, AND NON-TRANSITORY COMPUTER-READABLE RECORDING MEDIUM STORING A PROGRAM USING THE SAME

(71) Applicant: NIHON DEMPA KOGYO CO., LTD., Tokyo (JP)

(72) Inventors: Shunichi Wakamatsu, Saitama (JP); Wakako Shinobu, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 100 days.

(21) Appl. No.: 15/861,667

(22) Filed: Jan. 3, 2018

(65) Prior Publication Data

US 2018/0195942 A1     Jul. 12, 2018

(30) Foreign Application Priority Data

Jan. 11, 2017 (JP) ................................ 2017-002886

(51) Int. Cl.
*G01N 5/02* (2006.01)
*G01G 3/13* (2006.01)
(Continued)

(52) U.S. Cl.
CPC ................. *G01N 5/02* (2013.01); *G01G 3/13* (2013.01); *G01G 3/16* (2013.01); *G01G 23/01* (2013.01);
(Continued)

(58) Field of Classification Search
CPC .. G01N 29/036; G01N 29/022; G01N 29/222; G01N 29/4427; G01N 33/487;
(Continued)

(56) References Cited

U.S. PATENT DOCUMENTS 7,488,602 B2 * 2/2009 Pachl ................. G01N 21/8483
435/26
2007/0245810 A1 * 10/2007 Carter ............... B01L 3/502723
73/53.01

(Continued)

FOREIGN PATENT DOCUMENTS

JP        2009-206792        9/2009

*Primary Examiner* — Lisa M Caputo
*Assistant Examiner* — Nigel H Plumb
(74) *Attorney, Agent, or Firm* — JCIPRNET

(57) ABSTRACT

A sensing sensor includes a main body portion, a piezoelectric resonator, a connecting terminal, and an information storage. The main body portion includes a supply region to which the sample solution is supplied. The piezoelectric resonator is disposed to face the supply region and includes a capturing layer that captures a sensing object. The connecting terminal is configured to attachably/detachably connect a conductive path connected to an electrode of the piezoelectric resonator to a frequency measuring unit. The information storage stores calibration curve information to specify a calibration curve that indicates a relationship between a density of the sensing object and a frequency variation amount of the piezoelectric resonator before and after supplying the sample solution.

6 Claims, 12 Drawing Sheets

(51) Int. Cl.
  *G01N 29/02* (2006.01)
  *G01G 3/16* (2006.01)
  *G01N 29/036* (2006.01)
  *H01L 41/04* (2006.01)
  *G01N 15/06* (2006.01)
  *G01G 23/01* (2006.01)
  *H01L 41/113* (2006.01)
  *G01N 29/22* (2006.01)
  *G01N 29/44* (2006.01)
  *H01L 41/047* (2006.01)
  *G01H 13/00* (2006.01)

(52) U.S. Cl.
  CPC ....... *G01N 15/0637* (2013.01); *G01N 29/022* (2013.01); *G01N 29/036* (2013.01); *G01N 29/222* (2013.01); *G01N 29/4427* (2013.01); *H01L 41/042* (2013.01); *H01L 41/1132* (2013.01); *G01H 13/00* (2013.01); *G01N 2291/02818* (2013.01); *H01L 41/0477* (2013.01)

(58) Field of Classification Search
  CPC ........ G01N 5/02; G01N 15/0637; G01G 3/13; G01G 3/16; G01G 23/01; H01L 41/042; H01L 41/1132; H01L 41/0477; G01H 13/00
  See application file for complete search history.

(56) References Cited

U.S. PATENT DOCUMENTS

2009/0270765 A1* 10/2009 Ghesquiere ........ A61B 5/14532
  600/583
2015/0090035 A1*  4/2015 Kukita ................ G01N 29/036
  73/579
2016/0011178 A1*  1/2016 Hoenes ................ G01N 33/525
  435/29

* cited by examiner

SENSOR INFORMATION

| IDENTIFICATION CODE | 01234567 - - - - - - |
|---|---|
| SERIAL NUMBER | 01234567 |
| LOT NUMBER | 000001 |
| DATE OF MANUFACTURE | SEPTEMBER 1, 2015 |
| WARRANTY TERM | SEPTEMBER 1, 2016 |
| CUSTOMER CODE | 0101 |
| MEASUREMENT CODE | 0101 |
| CALIBRATION CURVE APPROXIMATION | FORMULA 1: LINEAR FUNCTION |
| CALIBRATION CURVE EQUATION A | CONSTANT A : 54.92 |
| CALIBRATION CURVE EQUATION B | CONSTANT B : 109.57 |
| CALIBRATION CURVE EQUATION C | CONSTANT C : 0 |

FIG. 12

SENSING SENSOR, INFORMATION PROCESSING DEVICE, SENSING METHOD, AND NON-TRANSITORY COMPUTER-READABLE RECORDING MEDIUM STORING A PROGRAM USING THE SAME

CROSS-REFERENCE TO RELATED APPLICATIONS

This application is based on and claims priority under 35 U.S.C. § 119 to Japanese Patent Application No. 2017-002886, filed on Jan. 11, 2017, the entire content of which is incorporated herein by reference.

TECHNICAL FIELD

This disclosure relates to a technical field in which a sensing object in a sample solution is sensed by using a piezoelectric resonator where its unique vibration frequency varies when the sensing object is adsorbed by an adsorbing layer arranged on a surface of the piezoelectric resonator.

DESCRIPTION OF THE RELATED ART

In a clinical field, a simple method called Point of care Testing (POCT), which is typified by a self-monitoring of blood glucose level, for example, is spreading. As a sensing method of a sensing object in a sample solution, for example, a trace amount of protein, there is disclosed a sensing device using a sensing sensor utilizing, for example, a Quartz Crystal Microbalance (QCM) as disclosed in Japanese Unexamined Patent Application Publication No. 2009-206792. The QCM uses a crystal resonator where an adsorbing layer that adsorbs the sensing object by an antigen-antibody reaction is arranged on a surface of an excitation electrode. The QCM grasps a load by the mass of the adsorbed sensing object in the sample solution as a frequency variation of the crystal resonator, and thus the sensing object is quantitated. The use of this basic principle allows application to simple measurement employed for diagnosis in a medical front and food inspection.

In such sensing device, in order to measure a density of a sensing object, a calibration curve is generated. In the calibration curve, frequency variation amounts when sensing objects, which are prepared in advance, are supplied to the sensing sensor correspond to the densities of the sensing objects. Then, the density of the sensing object included in the sample solution is measured by the frequency variation amount when the sample solution is supplied to the sensing sensor and the calibration curve.

Since the sensing sensor includes an antibody film whose accuracy varies depending on a production lot, it is necessary to generate the calibration curve for each production lot. Therefore, a user needs to generate a calibration curve corresponding to the sensing sensor with the relevant production lot before measuring the sensing object, and then measure the density of the sensing object using the generated calibration curve. However, in order to generate an accurate calibration curve, there is a problem that an advanced expertise and a detailed measurement in a laboratory are necessary. For example, when a plurality of kinds of sensing objects are measured, it is necessary to generate calibration curves corresponding to respective sensing objects, thus causing a problem of requiring a lot of time and work.

A need thus exists for a sensing sensor, an information processing device, a sensing method, and software which are not susceptible to the drawback mentioned above.

SUMMARY

According to an aspect of this disclosure, there is provided a sensing sensor that includes a main body portion, a piezoelectric resonator, a connecting terminal, and an information storage. The main body portion includes a supply region to which the sample solution is supplied. The piezoelectric resonator is disposed to face the supply region and includes a capturing layer that captures a sensing object. The connecting terminal is configured to attachably/detachably connect a conductive path connected to an electrode of the piezoelectric resonator to a frequency measuring unit. The information storage stores calibration curve information to specify a calibration curve that indicates a relationship between a density of the sensing object and a frequency variation amount of the piezoelectric resonator before and after supplying the sample solution.

BRIEF DESCRIPTION OF THE DRAWINGS

The foregoing and additional features and characteristics of this disclosure will become more apparent from the following detailed description considered with reference to the accompanying drawings, wherein:

FIG. 12 is an explanatory drawing illustrating sensor information displayed on a display unit.

DETAILED DESCRIPTION

Figure 1:
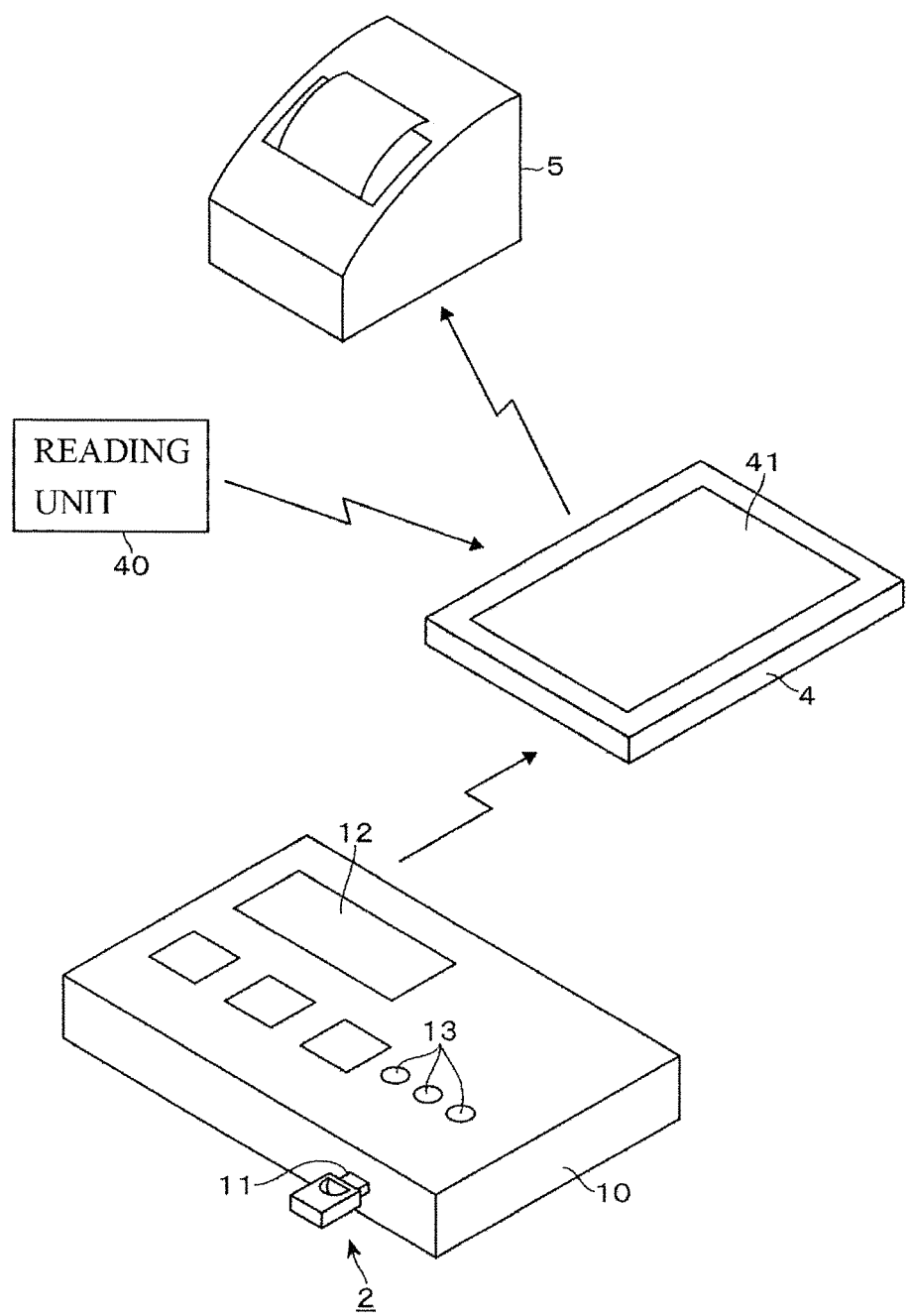
FIG. 1 is a perspective view of a sensing device in which an information processing device according to an embodiment of the disclosure is applied.

The following describes a sensing device that executes a sensing method according to an embodiment. This sensing device includes a sensing sensor 2, a frequency measurement unit 10, a control panel 4, and a printer 5, as illustrated in FIG. 1. The sensing sensor 2 is supplied with a sample solution containing a sensing object. The frequency measurement unit 10 is a frequency measuring unit including an oscillator circuit to which this sensing sensor 2 is attachably/detachably connected. The control panel 4 is an information processing device that receives information of a frequency difference output from this frequency measurement unit 10 and includes software that performs an operation of a density of the sample solution. The printer 5 is an output unit to output an arithmetic operation result operated in the control panel 4.

Figure 2:
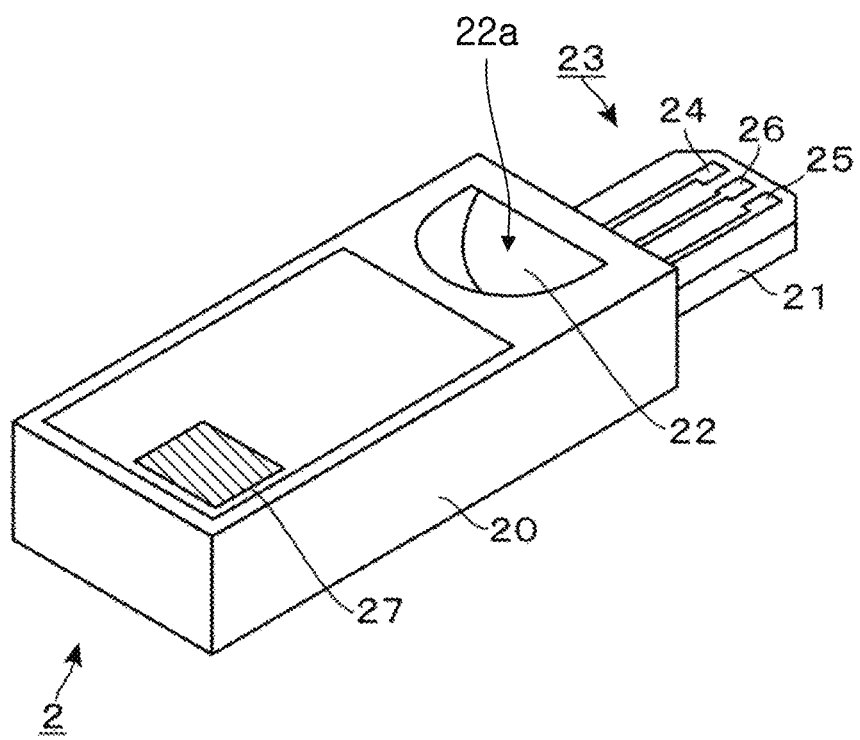
FIG. 2 is a perspective view of a sensing sensor according to the embodiment of the disclosure.
Figure 3:
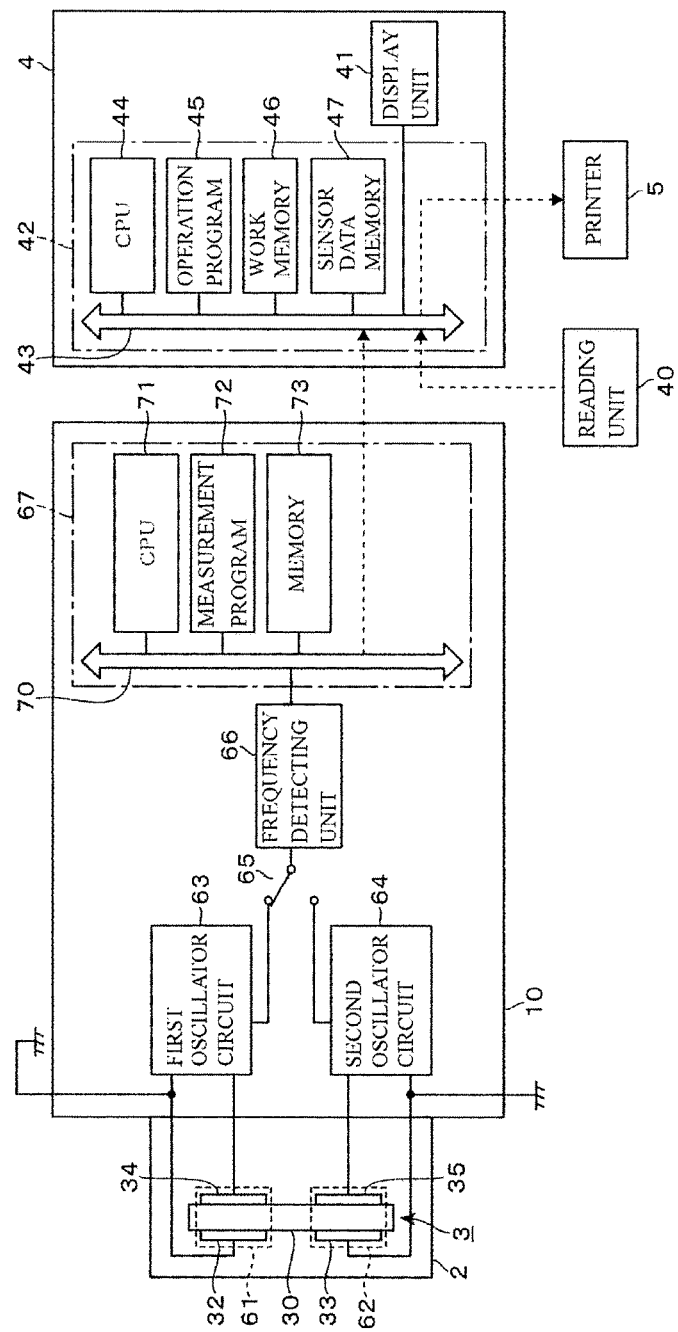
FIG. 3 is a block diagram to describe an oscillator circuit and a circuit of a main body portion of the sensing device of the disclosure.

The sensing sensor 2 is configured so as to be able to detect an amount of a sensing object, such as a component of a sensing target, for example, an allergen as an antigen, contained in a sample solution as, for example, a sample, by utilizing a microfluidic chip. The sensing sensor 2, as illustrated in FIG. 2 and FIG. 3, includes a wiring board 21, a main body portion 20, and a crystal resonator 3. The main body portion 20 includes an injection port 22 to which the sample solution injected. The crystal resonator 3 is a piezoelectric resonator. The crystal resonator 3 includes excitation electrodes 32 and 33 formed of, for example, Au (gold) on a front surface side of a crystal element 30. The crystal resonator 3 includes excitation electrodes 34 and 35 so as to oppose to the excitation electrodes 32 and 33 on a back surface side. A region between these excitation electrode 32 and excitation electrode 34 serves as a first vibrating region 61 and a region between the excitation electrode 33 and the excitation electrode 35 serves as a second vibrating region 62.

The crystal resonator 3 is secured to a top surface side of the wiring board 21 inside the main body portion 20 illustrated in FIG. 2. The excitation electrodes 32 and 33 disposed in the crystal resonator 3 are electrically connected to a conductive path 26 extending on a surface of the wiring board 21. The excitation electrodes 34 and 35 are electrically connected to conductive paths 24 and 25, respectively. The conductive paths 24, 25, and 26 are each extended to a connecting terminal 23 formed outside the main body portion 20 in the wiring board 21.

Figure 4:
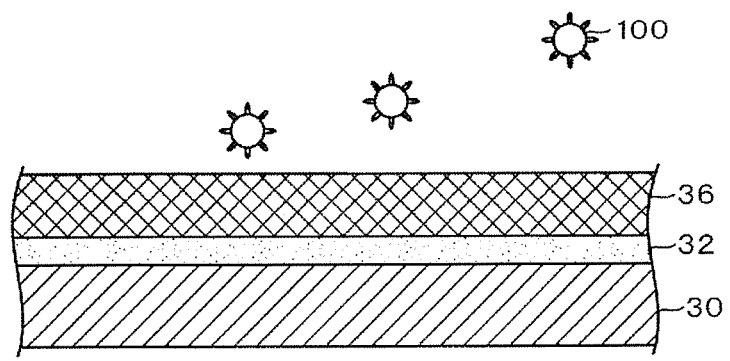
FIG. 4 is an explanatory drawing that describes a sensing object and an adsorbing layer arranged on a surface of an excitation electrode.

A surface of the excitation electrode 32, one of the excitation electrodes 32 and 33 on the front surface side, includes an adsorbing layer 36 as a capturing layer that selectively binds to a sensing object 100, for example, an allergen, as illustrated in FIG. 4. Inside the sensing sensor 2, a supply region 22a constituted, for example, of a flow path for a sample solution is formed. The supply region 22a is connected to the injection port 22 and for supplying the sample solution to a front surface side of the crystal resonator 3. In the supply region 22a, the excitation electrodes 32 and 33 on the front surface side of the crystal resonator 3 are disposed so as to align on the right and left with respect to a flow direction of the flow path.

On a top surface of the main body portion 20, a sensor information portion 27 is disposed. The sensor information portion 27 is an information storage where sensor information of the sensing sensor 2 is written, for example, in a two-dimensional barcode. As the sensor information, there is written production information of the sensing sensor 2, such as an identification code, a serial number, a lot number, a date of manufacture, a warranty term, a customer code, and a measurement code, as well as a kind of an approximated curve to specify a calibration curve of a sensing object as a sensing target, which will be described later, and calibration curve information of values of constants A to C for this approximated curve.

Regarding these kind of the approximated curve and values of the constants A to C for the approximated curve, for example, the calibration curve is generated in advance for each production lot of the sensing sensor 2 by the manufacturer, and the kind of the approximated curve (kind of calibration curve equation) and constant values for this calibration curve are obtained and written in.

Returning to FIG. 3, the frequency measurement unit 10 includes a first oscillator circuit 63 and a second oscillator circuit 64 constituted of, for example, a Colpitts circuit. The frequency measurement unit 10 includes a connection portion 11 to which the connecting terminal 23 of the sensing sensor 2 is attachably/detachably connected on a side surface as illustrated in FIG. 1. The connection portion 11 internally includes a terminal portion (not illustrated) formed so as to correspond to the conductive paths 24, 25, and 26 formed in the sensing sensor 2. As soon as the above-described connecting terminal 23 of the sensing sensor 2 is inserted into the connection portion 11 formed on a front surface of the frequency measurement unit 10, the conductive path 26 is grounded and the conductive paths 24 and 25 are electrically connected to the first oscillator circuit 63 and the second oscillator circuit 64, respectively. The first oscillator circuit 63 oscillates the first vibrating region 61 and the second oscillator circuit 64 oscillates the second vibrating region 62.

The frequency measurement unit 10 includes a switch 65, a frequency detecting unit 66, and a frequency difference calculation unit 67. On a top surface of the frequency measurement unit 10, a display unit 12 and lamp portions 13 that illuminate an error lamp and a normal lamp are disposed. Output sides of the first and second oscillator circuits 63 and 64 are connected to the switch 65. The frequency detecting unit 66 disposed in a position after the switch 65 performs digital processing of a frequency signal input from the first and second oscillator circuits 63 and 64. Specifically describing, time-series data of an oscillation frequency "F1" output from the first oscillator circuit 63 and time-series data of an oscillation frequency "F2" output from the second oscillator circuit 64 are obtained. In the sensing device of the embodiment, the switch 65 performs an intermittent oscillation in which a channel 1 that connects the frequency detecting unit 66 to the first oscillator circuit 63 and a channel 2 that connects the frequency detecting unit 66 to the second oscillator circuit 64 are alternately switched. This ensures avoiding interference between the two vibrating regions 61 and 62 of the sensing sensor 2 and obtaining a stable frequency signal.

The frequency difference calculation unit 67 is constituted of a computer. Reference numeral 70 in the drawing denotes a bus. A CPU 71 that performs various kinds of operations, a measurement program 72, and a memory 73 are connected to the bus 70. The memory 73 stores the time-series data of the frequency signals corresponding to a frequency measurement values output from the respective channels. The measurement program 72 transmits a signal to switch the switch 65. The measurement program 72 performs arithmetic processing based on the time sharing data of digital values of the frequency signals output from the channel 1 and the channel 2 measured in the frequency detecting unit 66. The measurement program 72 is incorporated with, for example, a step group that measures a frequency difference measurement value based on a frequency difference between the two vibrating regions 61 and 62.

Figure 5:
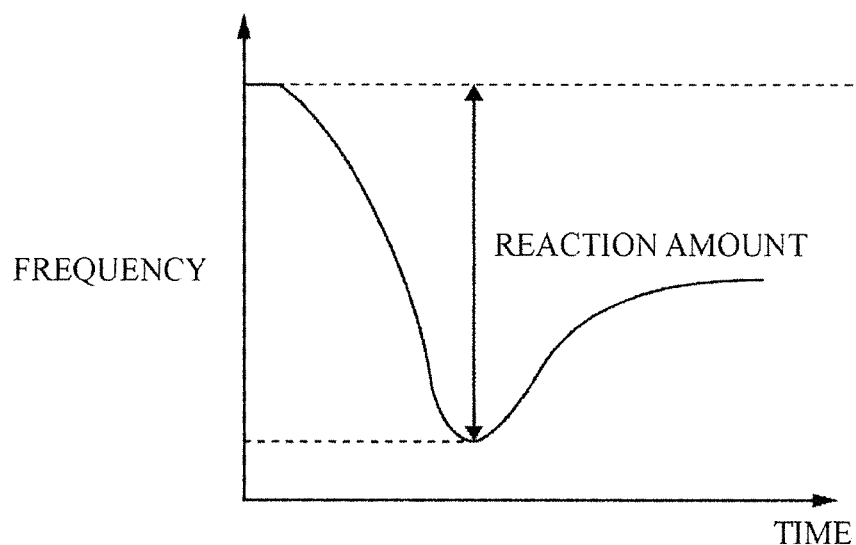
FIG. 5 is a characteristic diagram illustrating a temporal variation of an output frequency after a sample solution supply.

A description will be given of the frequency difference measurement value. When the sensing object 100, such as the allergen, is contained in the sample solution, as soon as the sample solution passes through the supply region, the sensing object 100 of an amount proportionating to a density of the sensing object 100 contained in the sample solution is adsorbed to the adsorbing layer 36 disposed on the surface of the excitation electrode 32, for example, by a hydrophobic bond. This gives a load of a mass of the sensing object 100 adsorbed to the adsorbing layer 36 to a mass of this excitation electrode 32. The frequency taken out from the first oscillator circuit 63 at this time varies so as to show a local minimal value after the sensing object 100 is adsorbed as illustrated in FIG. 5. A base line, for example, a frequency difference from the output frequency before the sample solution supply to the frequency that becomes the local minimal value, is determined by a mass load effect according to the amount of the sensing object 100 adsorbed to the adsorbing layer 36.

Figure 6A:
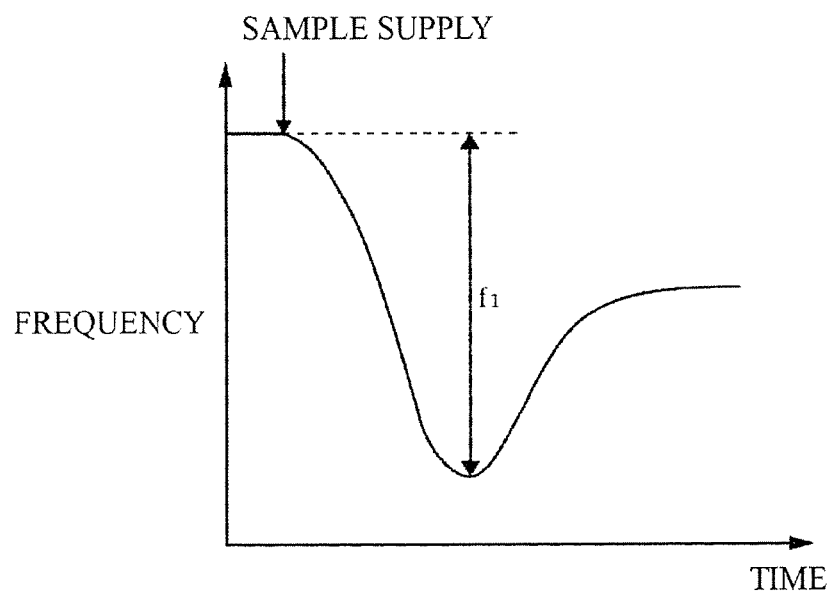
FIG. 6A and FIG. 6B are characteristic diagrams illustrating temporal variations of output frequencies in a first vibrating region and a second vibrating region.
Figure 6B:
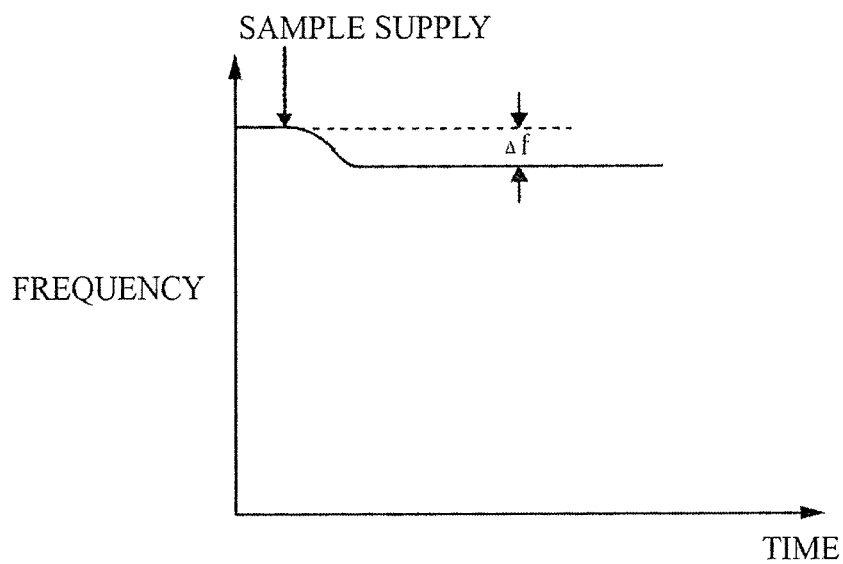
Figure 7:
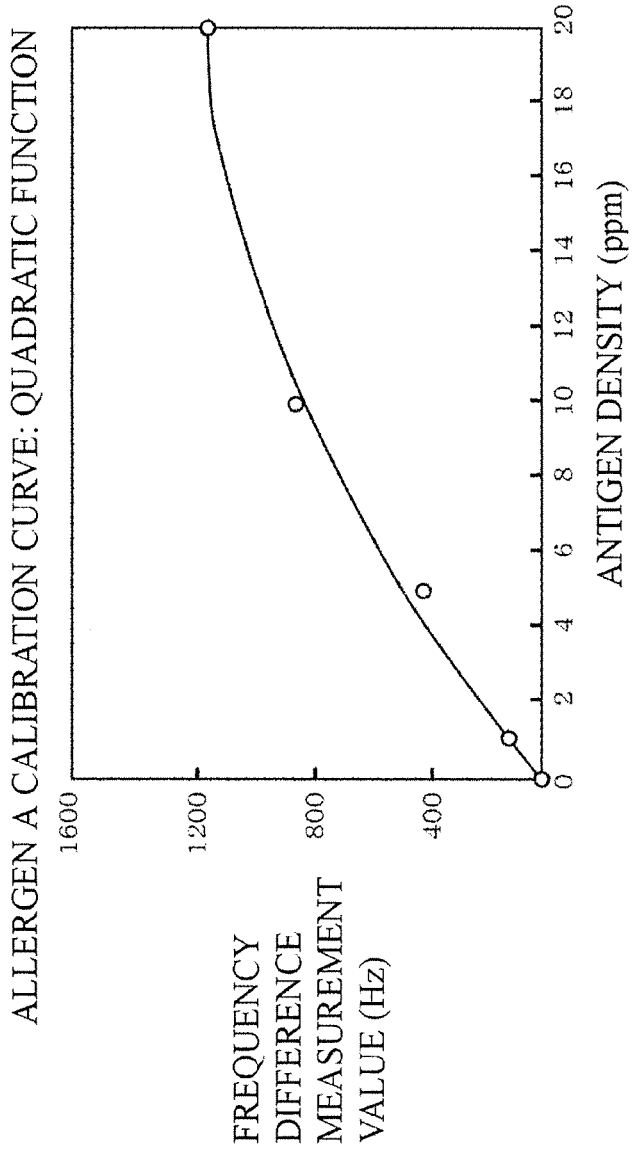
FIG. 7 is an explanatory drawing illustrating an example of a function stored in a memory.

The above-described sensing sensor 2 includes the first and second vibrating regions 61 and 62 on the common crystal element 30. When the sample solution contains the sensing object 100, the frequency taken out from the first vibrating region 61, in addition to having a variation in the frequency due to a temperature and a viscosity of the sample solution, becomes a further decreased frequency by the mass load effect due to this sensing object 100 being adsorbed to the adsorbing layer by an antigen-antibody reaction. Therefore, as soon as the sample solution is supplied to the sensing sensor 2, a variation value of the frequency from the base line in the oscillation frequency F1 output from the channel 1 becomes f1 as illustrated from FIG. 6A. Meanwhile, since the adsorbing layer 36 is not disposed in the second vibrating region 62, the sensing object 100 is not adsorbed, thus occurring no variation of the frequency by the mass load effect. In view of this, in the oscillation frequency F2 output from the channel 2 connected to the second vibrating region 62, a variation value of the frequency from the base line becomes Δf corresponding to the temperature and the viscosity of the sample solution.

The first vibrating region 61 and the second vibrating region 62 are formed on the common crystal element 30 and disposed in the common supply region of the sample solution in the sensing sensor 2. Therefore, the temperature and the viscosity of the sample solution can be regarded as being under an identical condition. Accordingly, subtracting the frequency variation Δf of the oscillation frequency F2 in the second vibrating region 62 from the frequency variation f1 of the oscillation frequency F1 in the first vibrating region 61 ensures cancelling the variation of the frequency due to the temperature and the viscosity of the sample solution. Accordingly, in the frequency difference calculation unit 67, a frequency difference measurement value f' (f1−Δf=f') that is a frequency variation amount corresponding to the mass load effect due to the adsorption of the sensing object 100 is output.

Returning to FIG. 3, the control panel 4 is constituted of, for example, a tablet terminal and includes a calibration curve calculation unit 42 as a data processing unit constituted of a computer. The calibration curve calculation unit 42 includes a CPU 44, an operation program 45, a work memory 46, and a sensor data memory 47. The calibration curve calculation unit 42 is configured such that the sensor information is input to the calibration curve calculation unit 42 from a reading unit 40, such as optical reading means, for reading the two-dimensional barcode, and a display unit 41 illustrated in FIG. 1 is connected to the calibration curve calculation unit 42. The calibration curve calculation unit 42 is configured such that an arithmetic operation result is output to an operation output unit, such as the printer 5, from the calibration curve calculation unit 42.

The operation program 45 generates a calibration curve corresponding to a production lot of the sensing sensor 2 based on the calibration curve information included in the sensor information of the sensing sensor 2 read by the reading unit 40, and the operation program 45 receives the frequency difference measurement value output from the frequency difference calculation unit 67 to obtain a density of the sample solution based on the frequency difference measurement value f' and the calibration curve equation of the generated calibration curve.

A description will be given of the calibration curve. As described above, the frequency difference measurement value is determined by a weight of the sensing object 100 adsorbed in the adsorbing layer 36. Since the sensing object 100 is adsorbed using the antigen-antibody reaction, an adsorption amount of the sensing object 100 is determined by a rate of reaction of this antigen-antibody reaction and a density of the sensing object (a density of the antigen) in the sample solution. Accordingly, firstly obtaining the calibration curve in which the frequency difference measurement value corresponds to the density of the sensing object, and applying the frequency difference measurement value to the calibration curve, for example, assigning the frequency difference to the calibration curve equation representing the calibration curve in an equation, ensure calculating the density of the sensing object.

FIG. 7 to FIG. 10 illustrate calibration curves of four kinds of allergens of respective A to D. The calibration curves differ by the type of the allergen as the sensing object, and approximation formulae to generate the calibration curve equations representing optimal calibration curves in the equations for the respective allergens differ. In view of this, as illustrated in FIG. 7 to FIG. 10, the calibration curve equations applied with the following approximation formulae are optimal: in the case of the allergen A, an approximation formula of a quadratic function; in the case of the allergen B, an approximation formula of a linear function; in the case of the allergen C, an approximation formula of a logarithmic function; and in the case of the allergen D, an approximation formula represented by an exponential function.

In view of this, the sensor data memory 47 internally stores models of function formulae used as the calibration curve equations. For example, when Y is the frequency difference measurement value f' and X is the density of the sensing object (the antigen density), for example, the following Formula 1 to Formula 4 are stored.

$$Y=AX+B \qquad \text{Formula 1:}$$

$$Y=AX^2+BX+C \qquad \text{Formula 2:}$$

$$Y=A\ln(X)+B \qquad \text{Formula 3:}$$

$$Y=AX^B \qquad \text{Formula 4:}$$

Then, as described below, the optimal approximation formula is selected for each type of the sensing objects. Even in the sensing sensors 2 that target an identical sensing object, there is a variation in adsorbing performances of the adsorbing layers 36, and, for example, inclinations of the calibration curve equations differ depending on the production lot. In view of this, it is configured that setting constant parts (A to C) in each formula for each production lot of the sensing sensors 2 ensures generating the approximation formula.

Figure 11:
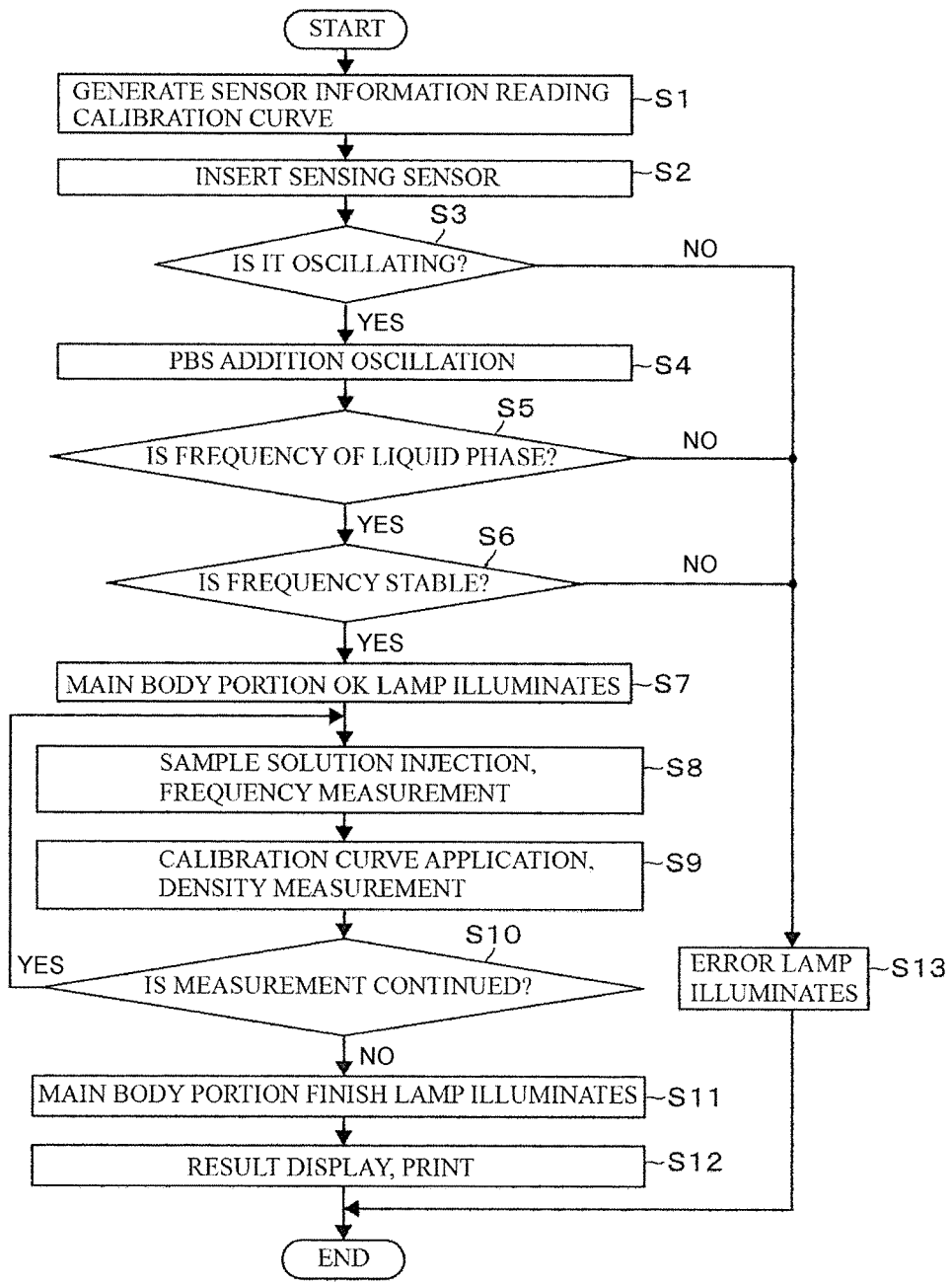
FIG. 11 is a flowchart describing a sensing method according to the embodiment of the disclosure.

Subsequently, an action of the sensing device according to the embodiment will be described with reference to a flowchart illustrated in FIG. 11. First, at Step S1, the reading unit 40 reads the sensor information portion 27 disposed in the sensing sensor 2, and inputs the sensor information to the calibration curve calculation unit 42. FIG. 12 illustrates the sensor information read by the reading unit 40. FIG. 12 illustrates an exemplary state where the sensor information is written into the sensor data memory 47 of the control panel 4 and displayed on the display unit 41. In this screen, in addition to production information of the sensing sensor 2, such as the identification code, the serial number, the lot number, the date of manufacture, the warranty term, the customer code, and the measurement code, calibration curve information, such as a kind of the approximated curve applied to the calibration curve of the sensing object as the sensing target (calibration curve approximation in FIG. 12) and the values of the constants A to C for this calibration curve (calibration curve equation A to C in FIG. 12), are read out.

Figure 8:
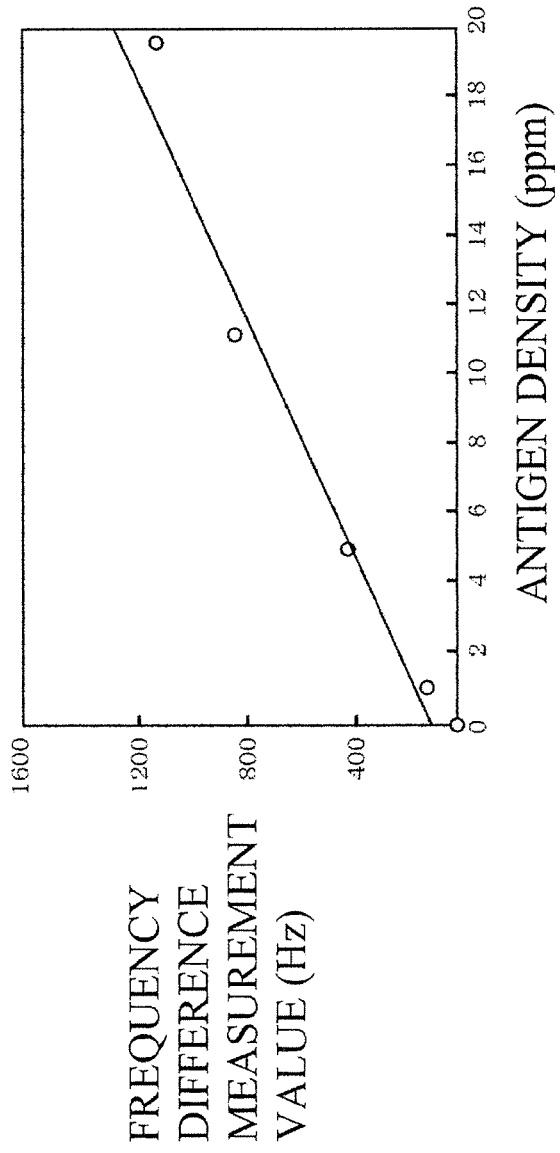
FIG. 8 is an explanatory drawing illustrating an example of a function stored in the memory.
Figure 9:
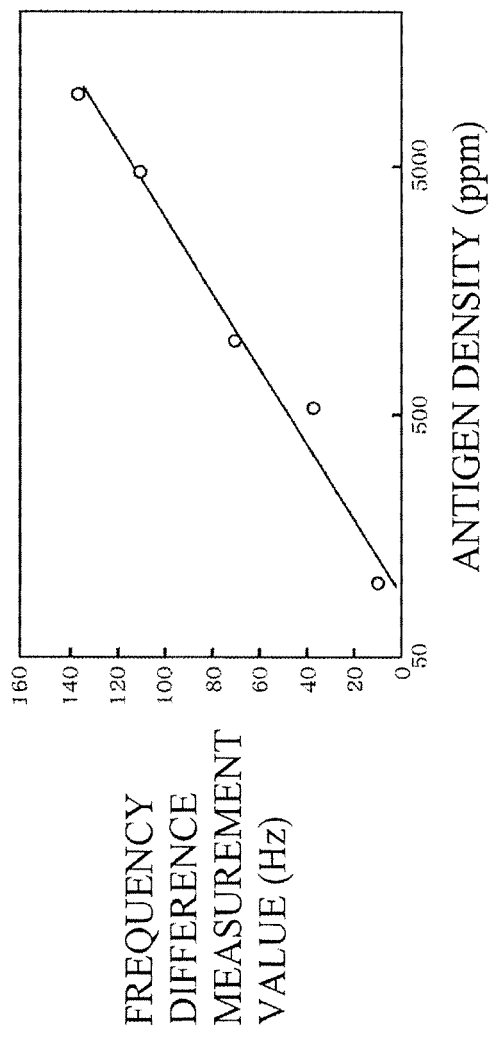
FIG. 9 is an explanatory drawing illustrating an example of a function stored in the memory.
Figure 10:
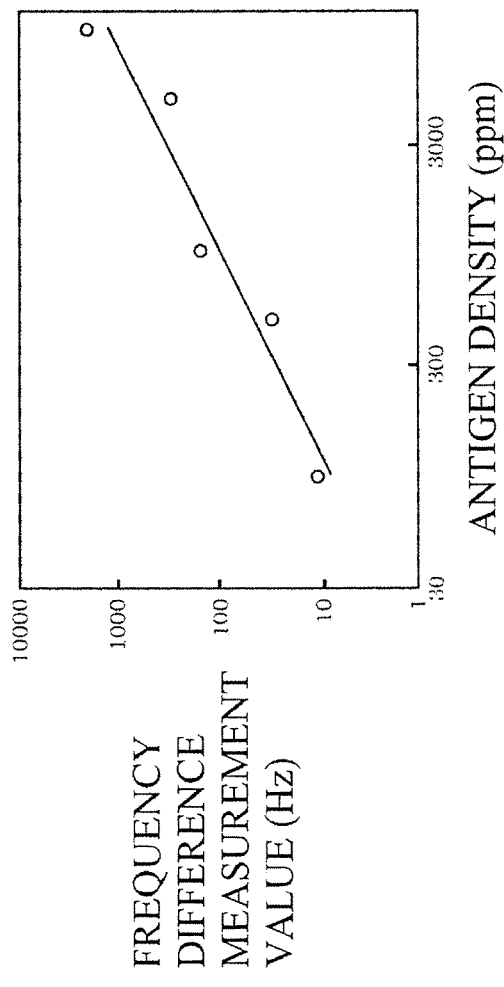
FIG. 10 is an explanatory drawing illustrating an example of a function stored in the memory.

The operation program 45 in the control panel 4 generates the calibration curve using a kind of the approximated curve and the values of the constants A to C. In this example, for example, the sensing sensor 2 targets the allergen B for sensing. When the calibration curve illustrated in FIG. 8 is used, the sensor information portion 27 includes information that Formula 1: Y=AX+B is selected as the approximated curve and information that it is A=54.92, B=109.57, and C=0 for the respective constants A to C. The operation program 45 inputs the respective constants A to C into Formula 1: Y=AX+B. As described above, since Y in the calibration curve is the frequency difference measurement value f', X is the antigen density, the calibration curve equation in the sensing sensor 2: (frequency difference measurement value f')=54.92×(antigen density)+109.57 is obtained and written into the sensor data memory 47.

Subsequently, at Step S2, this sensing sensor 2 is connected to the frequency measurement unit 10 and the first and the second oscillator circuits 63 and 64 are each oscillated. As illustrated in Step S3, in the control panel 4, it is confirmed whether the crystal resonator 3 is oscillated and the frequency difference measurement value f' between the first oscillator circuit 63 and the second oscillator circuit 64 is output in a normal value or not. Then, at Step S4, a user injects a phosphate buffer solution into the injection port 22 of the sensing sensor 2. This causes the phosphate buffer solution (PBS) to flow through the flow path to fill the supply channel with the phosphate buffer solution. As a result, the front surface side of the crystal resonator 3 transitions from a gas phase to a liquid phase, and the oscillation frequency of the crystal resonator 3 decreases. At this time, in the control panel 4, it is confirmed whether the frequency difference measurement value f' measured in the frequency measurement unit 10 is a value of when the surface of the crystal resonator is filled with the liquid phase or not as illustrated in Step S5. Furthermore, at Step S6, the frequency difference measurement value f' is confirmed at regular intervals to confirm whether a stable value is output or not as the frequency difference measurement value. When it is Yes at Step S6, then the step proceeds to Step S7 (main body portion OK lamp illuminates), a lamp is illuminated in the lamp portions 13 of the frequency measurement unit 10 to indicate that a preparation of a sample solution measurement is completed. In this example, when it is No at Step S3, Step S5, and Step S6, the error lamp is illuminated in the lamp portions 13 as illustrated in Step S13, and then the step is finished.

Subsequently, the step proceeds to Step S8, the user injects the sample solution into the injection port 22. This fills one side of the surface of the crystal resonator 3 with the sample solution, and as described above, the sensing object 100 included in the sample solution is adsorbed on the surface of the first excitation electrode 32. In view of this, in the frequency difference calculation unit 67, the frequency difference measurement value f' corresponding to the density of the sensing object (the antigen density) in the sample solution is calculated. The frequency difference measurement value is further transmitted to the calibration curve calculation unit 42 and stored in the work memory 46. After calculating the frequency difference measurement value at Step S8, in the case where a cleaning of surfaces of the flow path and the crystal resonator is necessary, a cleaning process to clean the surfaces of the flow path and the crystal resonator may be provided by, for example, causing a cleaning fluid, such as the phosphate buffer solution, to flow through the flow path.

Then at Step S9, the frequency difference measurement value is assigned to the calibration curve equation: (frequency difference measurement value f')=54.92×(antigen density)+109.57, which is obtained by reading the sensor information, to calculate the antigen density. Then the step proceeds to Step S10, the step returns to Step S8 when the measurement of the sample solution is continued, and the measurement continues. At Step S10, it is No when the measurement of the sample solution is finished and the step proceeds to Step S11 (main body portion finish lamp illuminates) to illuminate the lamp indicating the end of the measurement in the lamp portions 13 of the frequency measurement unit 10. The step further proceeds to Step S12 to display the density of the measured sample solution on the display unit 41 and print the measurement result with the printer 5, and then the step is finished. When Step S8 to Step S10 are repeated for several times, for example, the measurement results of the densities may be stored in the work memory 46 of the calibration curve calculation unit 42 and collectively output the measurement results of the densities, or result displays may be performed on the display unit 41 and printing of the measurement results may be performed with the printer 5 for each measurement of the sample solution.

According to the above-described embodiment, in measuring the density of the sensing object in the sample solution based on the frequency variation amount of the crystal resonator 3, the sensor information portion 27 that stores the sensor information is disposed in the sensing sensor 2 including the crystal resonator 3. Then, the sensor information is read before measuring the sample solution in the control panel 4, and the calibration curve equation is generated based on the sensor information. Furthermore, the sample solution is injected into the sensing sensor 2 and the frequency variation amount of the crystal resonator 3 is measured. Based on the frequency variation amount and the calibration curve equation, the density of the sensing object 100 is measured. Accordingly, the calibration curve equation corresponding to the sensing sensor 2 can be easily obtained, and the measurement with a high reliability can be performed.

In the case where after finishing a measurement with one sensing sensor 2, a measurement is performed using another sensing sensor 2 with an identical production lot, an identical calibration curve equation may be used. In such case, a step that determines whether the lot number is identical or not is performed after reading and obtaining the sensor information. When the lot number is identical, the step proceeds to Step 2, without changing the calibration curve equation. When the lot number is different, the calibration curve equation may be generated from the sensor information.

The above-described antigen density is the density estimated by an increase of the mass by the antigen adsorbed to the adsorbing layer 36. An adsorption efficiency of the antigen to the antibody differs with an activation value in an immune reaction, such as a temperature condition. In view of this, the density of the antigen may be corrected and quantified by an activation of the antigen-antibody reaction.

While the sensor information of the sensing sensor 2 may be read by the reading unit 40 and transmitted to the control panel 4, the sensor information may be stored, for example, in an IC disposed in the sensing sensor 2 as the information storage. Then, when the sensing sensor 2 is connected to the frequency measurement unit 10, in the frequency measurement unit 10, the sensor information may be read from the IC disposed in the sensing sensor 2 and transmitted to the control panel 4. The reading unit may be disposed in the control panel 4. Furthermore, the calibration curve equation applied to this sensing sensor 2 may be stored in the information storage.

Furthermore, the frequency measurement unit 10 and the control panel 4 may be connected with wire, such as a cable, or the frequency measurement unit 10 and the control panel 4 may be integrally constituted. Furthermore, for example, a common control unit may execute a step group performed by the frequency measurement unit 10 to calculate the frequency variation amount by measuring the frequency and a step group performed by the control panel 4 to obtain the density of the sample solution by the frequency variation amount and the calibration curve by obtaining the calibration curve information to generate the calibration curve.

An information processing device of the disclosure includes a reading unit and a data processing unit. The reading unit reads the calibration curve information stored in the information storage of the sensing sensor described above. The data processing unit obtains a density of a sensing object in a sample solution based on a frequency variation amount of a piezoelectric resonator before and after supplying the sample solution obtained from a measurement result of the frequency measuring unit and information of the calibration curve.

A sensing method of the disclosure uses the sensing sensor described above, the frequency measuring unit, and the information processing device described above. The sensing method includes a step of obtaining calibration curve information in the information storage and specifying a calibration curve, a step of connecting the sensing sensor to a frequency measuring unit and obtaining a frequency variation amount of a piezoelectric resonator before and after supplying a sample solution, and a step of obtaining a density of a sensing object in the sample solution from the frequency variation amount and the calibration curve specified by the calibration curve information.

Software of the disclosure is software including a program used in the information processing device described above. The program includes a step group configured to execute a step of reading calibration curve information in the information storage and specifying a calibration curve and a step of obtaining a density of a sensing object in a sample solution based on a frequency variation amount of a piezoelectric resonator before and after supplying the sample solution obtained from a measurement result of a frequency measuring unit and the calibration curve.

With this disclosure, an information storage is provided to store sensor information in a sensing sensor including a piezoelectric resonator in measuring a density of a sensing object in a sample solution based on a frequency variation amount of the piezoelectric resonator. Then, the sensor information is obtained before measuring the sample solution, a calibration curve equation is generated based on the sensor information, and a density of the sensing object is measured based on the frequency variation amount of the piezoelectric resonator and the calibration curve equation. Accordingly, the calibration curve equation corresponding to the sensing sensor can be easily obtained, thus ensuring the measurement with high reliability.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A sensing sensor for detecting a density of a sensing object in a sample solution as a frequency variation of a piezoelectric resonator, the sensing sensor comprising:
   a main body portion that includes a supply region to which the sample solution is supplied;
   the piezoelectric resonator disposed to face the supply region, the piezoelectric resonator including a capturing layer that captures the sensing object;
   a connecting terminal configured to attachably/detachably connect a conductive path connected to an electrode of the piezoelectric resonator to a frequency measuring unit; and
   an information storage that stores calibration curve information to specify a calibration curve that indicates a relationship between a density of the sensing object and a frequency variation amount of the piezoelectric resonator before and after supplying the sample solution.

2. The sensing sensor according to claim 1, wherein the information storage includes a barcode.

3. The sensing sensor according to claim 1, wherein the calibration curve information includes information to select a function that corresponds to a calibration curve among a plurality of functions.

4. An information processing device comprising:
   a reading unit that reads the calibration curve information stored in the information storage of the sensing sensor according to claim 1; and
   a data processing unit that obtains the density of the sensing object in the sample solution based on the frequency variation amount of the piezoelectric resonator before and after supplying the sample solution obtained from a measurement result of the frequency measuring unit and information of the calibration curve.

5. A sensing method using the sensing sensor, the frequency measuring unit and the information processing device according to claim 4, the sensing method comprising:
   obtaining the calibration curve information in the information storage and specifying the calibration curve;
   connecting the sensing sensor to the frequency measuring unit and obtaining the frequency variation amount of the piezoelectric resonator before and after supplying the sample solution; and obtaining the density of the sensing object in the sample solution from the frequency variation amount and the calibration curve specified by the calibration curve information.

6. A non-transitory computer-readable recording medium storing a program for causing the information processing device according to claim 4 to function of:
reading the calibration curve information in the information storage and specifying the calibration curve; and
obtaining the density of the sensing object in the sample solution based on the frequency variation amount of the piezoelectric resonator before and after supplying the sample solution obtained from the measurement result of the frequency measuring unit and the calibration curve.

* * * * *